United States Patent

Matsuo et al.

[11] Patent Number: 5,305,272
[45] Date of Patent: Apr. 19, 1994

[54] SENSE AMPLIFIER CIRCUIT

[75] Inventors: Kenji Matsuo; Yasukazu Noine; Kazuhiko Kasai, all of Yokohama; Yoshihiro Kato, Kawasaki; Kazuaki Umetsu, Kitakami, all of Japan

[73] Assignee: Kabushiki Kaisha Toshiba, Kawasaki, Japan

[21] Appl. No.: 111,738

[22] Filed: Aug. 25, 1993

Related U.S. Application Data

[63] Continuation of Ser. No. 588,102, Sep. 25, 1990, abandoned.

[30] Foreign Application Priority Data

Sep. 28, 1989 [JP] Japan .................................. 1-253569

[51] Int. Cl.[5] ................................................ G11C 7/00
[52] U.S. Cl. .................................... 365/208; 365/203; 365/189.06; 365/189.11
[58] Field of Search .................... 365/189.09, 207, 208, 365/203, 205, 189.06, 189.11

[56] References Cited

U.S. PATENT DOCUMENTS

| | | | |
|---|---|---|---|
| 4,239,994 | 12/1980 | Stewart | 307/359 |
| 4,313,179 | 1/1982 | Heimeier et al. | 365/154 |
| 4,412,143 | 10/1983 | Patella et al. | 365/208 X |
| 4,439,843 | 3/1984 | Takamatsu | 365/218 |
| 4,451,906 | 5/1984 | Ikeda | 365/208 X |

FOREIGN PATENT DOCUMENTS

| | | | |
|---|---|---|---|
| 57-198594 | 12/1982 | Japan | 365/205 |
| 59-119589 | 7/1984 | Japan | 365/205 |

OTHER PUBLICATIONS

Kayano et al., "25-ns 256 Kx1/64x4 CMOS SRAM's," I.E.E.E. Journal of Solid State Circuits SC-21 Oct. 1986, No. 5, pp. 686-691.

Flannagan et al., "Two 13-ns 64K CMOS SRAM's with Very Low Active Power and Improved Asynchronous Circuit Techniques," I.E.E.E. Journal of Solid State Circuits SC-21, Oct. 1986, No. 5, pp. 692-703.

Primary Examiner—Joseph A. Popek
Attorney, Agent, or Firm—Finnegan, Henderson, Farabow, Garrett & Dunner

[57] ABSTRACT

In a sense amplifier circuit, an output potential is set in a data output state when an operation of the sense amplifier is a worst pass before the start of read access. In a memory read mode, when data corresponding to the worst-pass operation of the sense amplifier circuit is read out, the circuit is previously set in a corresponding data output state. A time delay (gate delay) by a gate does not occur. In contrast, when data corresponding to the best-pass operation of the sense amplifier circuit is read out, the gate delay occurs by this operation. The gate delay, however, is shorter than that of the worst pass. As a result, only the best pass is present as the operation mode of the sense amplifier circuit. Therefore, a high operation speed is achieved, so that a high read speed of the entire memory is achieved.

4 Claims, 4 Drawing Sheets

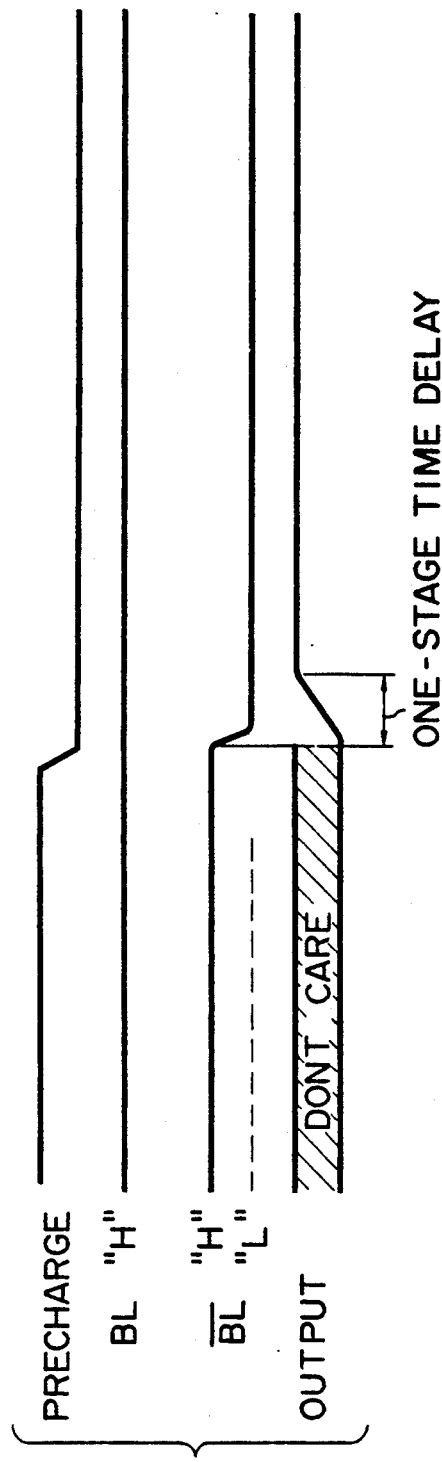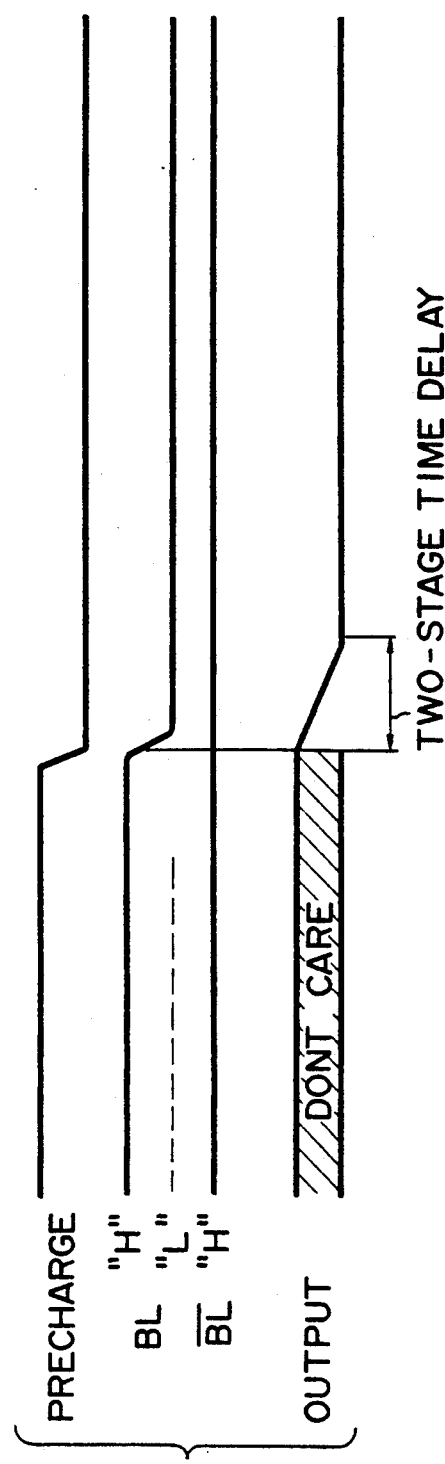
FIG. 2 (PRIOR ART)
FIG. 3 (PRIOR ART)

SENSE AMPLIFIER CIRCUIT

This application is a continuation of application Ser. No. 07/588,102, filed Sep. 25, 1990, now abandoned.

BACKGROUND OF THE INVENTION

1. Field of the Invention

The present invention relates to a sense amplifier for a semiconductor memory such as, e.g., an SRAM (static random access memory).

2. Description of the Related Art

As a conventional sense amplifier circuit for reading out bit-line data in a semiconductor memory, for example, a two-stage inverting sense amplifier circuit shown in FIG. 1 is used. More specifically, reference symbols BL and $\overline{BL}$ respectively denote a pair of bit lines of each column of memory cell array; SA1 and SA2, first and second sense amplifiers serving as a first stage for sensing and amplifying a potential difference between the pair of bit lines (BL and $\overline{BL}$); and SA3, a third sense amplifier serving as a second stage for sensing and amplifying a potential difference between outputs from the first and second sense amplifiers. These first to third sense amplifiers are respectively constituted by n-channel input type CMOS differential sense amplifiers each having a p-channel current mirror load.

The first sense amplifier SA1 is constituted by n-channel input transistors (N11 and N12), the gates of which are respectively connected to the bit lines (BL and $\overline{BL}$), and the sources of which are commonly connected to a ground potential $V_{SS}$, and p-channel load transistors (P11 and P12), the sources of which are commonly connected to a power supply potential $V_{CC}$, the gates of which are connected to each other, and the drains of which are respectively connected to the drains of the n-channel transistors (N11 and N12). The gate and the drain of the p-channel transistor P11 are connected to each other, and an output is extracted from the drain of the n-channel transistor N12. With this arrangement, a signal of high level "H" is output when a potential of the bit line $\overline{BL}$ is lower than a potential of the bit line BL, and a signal of low level "L" is output when the potential of the bit line BL is lower than the potential of the bit line $\overline{BL}$. That is, the first sense amplifier SA1 is an amplifier for outputting a non-inverted BL signal.

The second sense amplifier SA2 is constituted by n-channel input transistors (N21 and N22), the gates of which are respectively connected to the bit lines (BL and $\overline{BL}$), and the sources of which are commonly connected to the ground potential $V_{SS}$, and p-channel load transistors (P21 and P22), the sources of which are commonly connected to the power supply potential $V_{CC}$, the gates of which are connected to each other, and the drains of which are respectively connected to the drains of the n-channel transistors (N21 and N22). The gate and the drain of the p-channel transistor P22 are connected to each other, and an output is extracted from the drain of the n-channel transistor N22. With this arrangement, a signal of level "H" is output when a potential of the bit line BL is lower than a potential of the bit line $\overline{BL}$. That is, the second sense amplifier SA2 is an amplifier for outputting a non-inverted $\overline{BL}$ signal.

The third sense amplifier SA3 is constituted by n-channel input transistors (N31 and N32), the gates of which are respectively connected to an output node 41 of the first sense amplifier SA1 and an output node 42 of the second sense amplifier SA2, and the sources of which are commonly connected to the ground potential $V_{SS}$, and p-channel load transistors (P31 and P32), the sources of which are commonly connected to the power supply potential $V_{CC}$, the gates of which are connected to each other, and the drains of which are respectively connected to the drains of the n-channel transistors (N31 and N32). The gate and drain of the p-channel transistor P32 are connected to each other, and an output is extracted from the drain of the n-channel transistor N31 (output node 43). That is, the third sense amplifier SA3 is an amplifier for outputting inverted data of data from the first sense amplifier SA1. With this arrangement, a signal of "L" level is output when the output potential from the second sense amplifier SA2 is lower than that from the first sense amplifier SA1, and a signal of "H" level is output when the output potential from the first sense amplifier SA1 is lower than that from the second sense amplifier SA2.

An operation of the two-stage inverting sense amplifier circuit will be described with reference to FIGS. 2 and 3. In read access of a memory, it is assumed that the bit lines (BL and $\overline{BL}$) are precharged at "H" level during a precharging period. It is the assumed that "H" data is read out from a memory cell in a read mode. In this case, the potential of the bit line $\overline{BL}$ is pulled down to the $V_{SS}$ potential side so that a very small potential difference is generated between the bit lines BL and $\overline{BL}$ (which is kept at "H" level). As a result, the first sense amplifier SA1 outputs a signal of "H" level, and the second sense amplifier SA2 outputs a signal of "L" level, so that the third sense amplifier SA3 outputs a signal of "L" level.

In this case, taking an operation time of the first sense amplifier SA1 into consideration, a one-stage time delay occurs in an operation until the output level from the first sense amplifier SA1 is determined. More specifically, since the potential of the bit line BL at "H" level is supplied to the gate of the n-channel transistor N11 even during the precharging period, the n-channel transistor N11 is kept in an ON state. As a result, the p-channel load transistors (P11 and P12), the gates of which are connected to the drain of the n-channel transistor N11, are kept in the ON state. In contrast, the n-channel transistor N12 is turned off upon a decrease in gate potential of the n-channel transistor N12 (potential of the bit line $\overline{BL}$). Therefore, a one-stage gate time delay occurs because of this transition to the OFF state.

Taking an operation time of the second sense amplifier SA2 into consideration, a two-stage time delay occurs in an operation until the output level from the second sense amplifier SA2 is determined. More specifically, since the potential of the bit line BL at "H" level is supplied to the gate of the n-channel transistor N21 even during the precharging period, the n-channel transistor N21 is kept in the ON state. Meanwhile, since the n-channel transistor N22 is turned off upon a decrease in gate potential of the n-channel transistor N22 (potential of the bit line $\overline{BL}$), a one-stage time delay occurs. In addition, the n-channel transistor N22 is turned off so that the potential of the drain of the n-channel transistor N22 becomes the "H" level, and the p-channel load transistors (P21 and P22), the gates of which are connected to the drain of the n-channel transistor N22, are turned off. A one-stage time delay occurs because of this transition to the OFF state.

Taking an operation time of the third sense amplifier SA3 into consideration, a two-stage time delay occurs from an operation timing for receiving an "H" level output from the first sense amplifier SA1 and an "L" level output from the second sense amplifier SA2 to an operation timing for determining an output from the third sense amplifier SA3 as "L" level. More specifically, the n-channel transistor N31 is turned on by an "H" level input from the first sense amplifier SA1. An "L" level output is supplied from the second sense amplifier SA2. As a result, basically in the same manner as the second sense amplifier SA2, the n-channel transistor N32 and the p-channel transistors (P31 and P32) are sequentially turned off. A two-stage time delay occurs because of this transition to the OFF states of these transistors.

As a result, when "H" data is read out from a memory cell, in the operation until the two-stage inverting sense amplifier circuit outputs a signal of "L" level, the sum of the two-stage time delay by the second sense amplifier SA2 and the two-stage time delay by the third sense amplifier SA3, i.e., a total of four-stage time delay occurs.

In contrast, when "L" data is read out from a memory cell, in an operation until the two-stage sense amplifier circuit outputs a signal of "H" level, a three-stage time delay occurs. That is, when the potential of the bit line BL is pulled down to the $V_{SS}$ potential side to generate a very small potential difference between the bit line BL and the bit line $\overline{BL}$ (kept at "H" level), the first sense amplifier SA1 outputs a signal of "L" level. Subsequently, the second sense amplifier SA2 outputs a signal of "H" level, and the third sense amplifier SA3 outputs a signal of "H" level. In this case, taking the operation time of the first sense amplifier SA1 into consideration, the n-channel transistor N11 is turned off upon a decrease in potential of the bit line BL. A one-stage time delay occurs because of this transition. As a result, the n-channel transistor N11 is turned off, the potential of the drain becomes "H" level, and the p-channel load transistors (P11 and P12), the gates of which are connected to the drain of the n-channel transistor N11, are turned off. A one-stage time delay occurs because of this transition so that a total of two-stage time delay is occurs.

Taking the operation of the second sense amplifier SA2 into consideration, the n-channel transistor N21 is turned off upon a decrease in potential of the bit line BL. A one-stage time delay occurs because of this transition.

In the third sense amplifier SA3, the n-channel transistor N32 and the p-channel transistors (P31 and P32) are sequentially turned on by receiving the output of "H" level from the second sense amplifier SA2, and the n-channel transistor N31 is turned off by receiving the output of "L" level from the first sense amplifier SA1. As a result, a signal of "H" level is output. In this case, assuming that the above one-stage time delays are almost equal to each other, the time delay of the output of "H" level from the second sense amplifier SA2 is smaller than that of the output of "L" level from the first sense amplifier SA1 by one stage. As a result, in the third sense amplifier SA3, the turn-ON timings of the p-channel transistors (P31 and P32) and the turn-OFF timing of the n-channel transistor N31 are almost equal to each other. The apparent time delay of the operation is, therefore, one stage.

As a result, in the operation until the two-stage inverting sense amplifier circuit outputs the signal of "H" level when "L" data is read out from the memory cell the sum of the two-stage time delay by the first sense amplifier SA1 and the one-stage time delay by the third sense amplifier SA3, i.e., a total of three-stage time delay occurs.

In a two-stage inverting sense amplifier circuit as described above, in an operation, a three-stage time delay (in case of a best pass) or a four-stage time delay (in case of a worst pass) occurs. An operation speed of the sense amplifier circuit is limited by a worst-pass operation, thereby limiting a read speed of the entire memory.

The best and worst passes described above are also present in a one-stage sense amplifier circuit and a non-inverting sense amplifier circuit as well as a two-stage inverting sense amplifier circuit.

As described above, the operation speed of the conventional sense amplifier circuit is limited by the operation speed of the worst pass. Therefore, the read speed of the entire memory is limited, resulting in inconvenience.

SUMMARY OF THE INVENTION

The present invention has been made to solve the above problems, and has as its object to provide a sense amplifier circuit capable of a high operation speed and a high read speed of an entire memory.

A sense amplifier circuit according to the present invention is characterized in that an output potential is set in a data output state when an operation of the sense amplifier is a worst pass before the start of read access.

In a memory read mode, when data corresponding to the worst-pass operation of the sense amplifier circuit is read out, the circuit is previously set in a corresponding data output state. A time delay (gate delay) by a gate does not occur. In contrast, when data corresponding to the best-pass operation of the sense amplifier circuit is read out, the gate delay occurs by this operation. The gate delay, however, is shorter than that of the worst pass. As a result, only the best pass is present as the operation mode of the sense amplifier circuit. Therefore, a high operation speed is achieved, so that a high read speed of the entire memory is achieved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a timing chart showing an operation of a first sense amplifier in the sense amplifier circuit shown in FIG. 1;

FIG. 3 is a timing chart showing operations of second and third sense amplifiers in the sense amplifier circuit shown in FIG. 1;

DETAILED DESCRIPTION OF THE PREFERRED EMBODIMENTS

Figure 1:
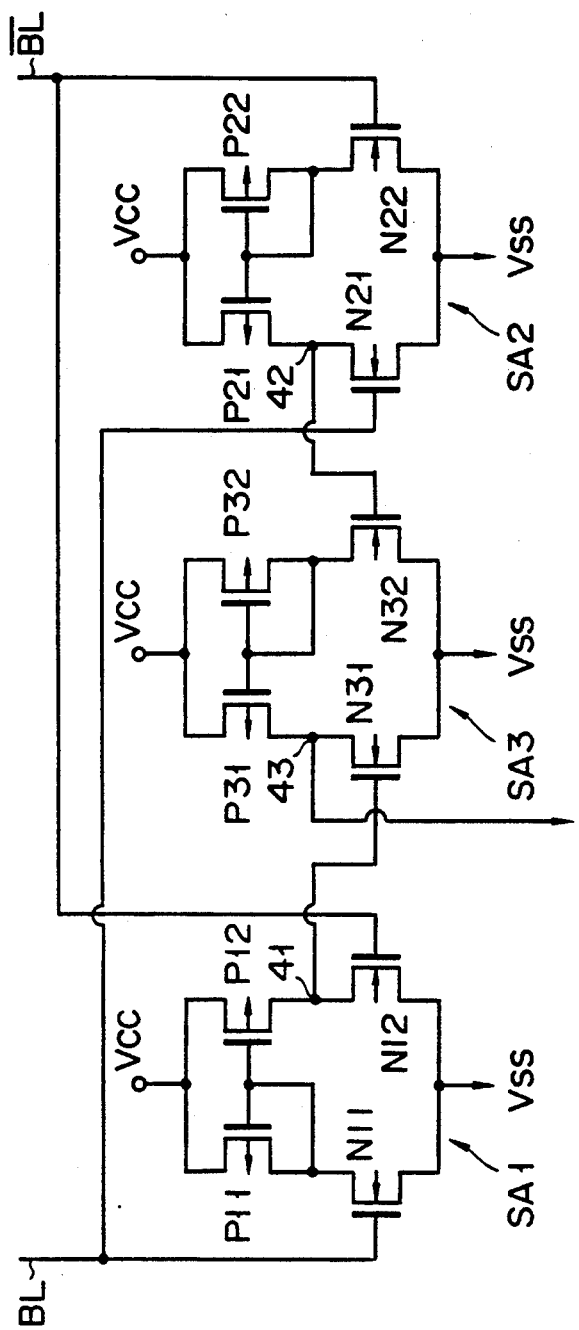
FIG. 1 is a circuit diagram showing a conventional sense amplifier circuit.

An embodiment of the present invention will be described in detail hereinafter with reference to the drawing.

Figure 4:
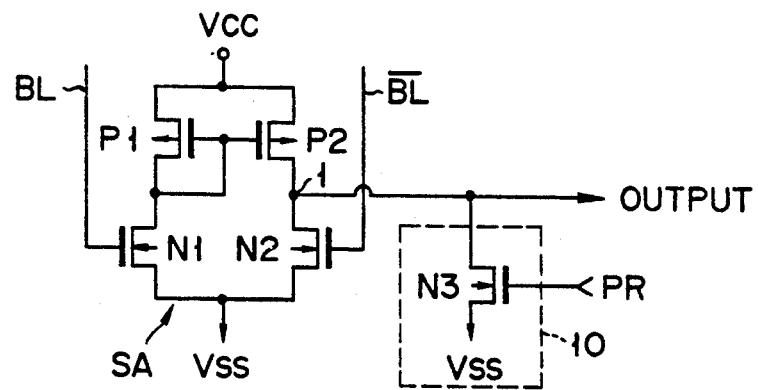
FIG. 4 is a circuit diagram of a embodiment of a sense amplifier circuit according to the present invention.

FIG. 4 shows a sense amplifier circuit for reading out bit-line data from a semiconductor memory, e.g., a one-stage non-inverting sense amplifier circuit. That is, reference symbols BL and $\overline{BL}$ denote a pair of bit lines of each column of a memory cell array; SA, a sense amplifier for sensing and amplifying a potential difference between the pair of bit lines (BL and $\overline{BL}$); and reference numeral 10, an output potential setting circuit for precharging an output node 1 of the sense amplifier SA during a precharge period at a predetermined potential.

The sense amplifier SA is constituted by, e.g, an n-channel input CMOS differential sense amplifier having a p-channel current mirror load, and is constituted by n-channel input transistors (N1 and N2), the gates of which are respectively connected to the bit lines (BL and $\overline{BL}$), and the sources of which are commonly connected to a ground potential $V_{SS}$, and p-channel load transistors (P1 and P2), the sources of which are commonly connected to a power supply potential $V_{CC}$, the gates of which are connected to each other, and the drains of which are respectively connected to the drains of the n-channel transistors (N1 and N2). The gate and drain of the p-channel transistor P1 are connected to each other, and an output is extracted from the drain (output node 1) of the n-channel transistor N2.

With this arrangement, a signal of "H" level is output when the potential of the bit line $\overline{BL}$ is lower than that of the bit line BL, and a signal of "L" level is output when the potential of the bit line BL is lower than the bit line $\overline{BL}$.

The output potential setting circuit 10 is constituted by, e.g., an n-channel transistor N3 connected between the output node 1 of the sense amplifier SA and the $V_{SS}$ potential. A precharge signal PR is applied to the gate of the n-channel transistor N3. As a result, the n-channel transistor N3 is turned on when the precharge signal PR is active ("H" level), and the n-channel transistor N3 is turned off when the precharge signal PR is not active ("L" level).

The output potential setting circuit 10, therefore, has a function to set an output potential of the sense amplifier SA in a data output state ("L" level output here) corresponding to a worst-pass operation of the sense amplifier SA before the start of read access (after release of precharge).

An operation mode as the best-pass operation of the sense amplifier SA is a case wherein the potential of the bit line $\overline{BL}$ becomes "L" level while the potential of the bit line BL is "H" level, and the signal of "H" level is output from the output node 1. In this mode, a one-stage time delay occurs. In contrast, the operation mode as the worst-pass operation of the sense amplifier SA is a case wherein potential of the bit line BL becomes "L" level while the potential of the bit line $\overline{BL}$ is "H" level, and a signal of "L" level is output from the output node 1. Since the "L" level output is, however, predetermined by the function of the output potential setting circuit 10, no time delay occurs in this operation mode.

As a result, the time delay in the operation of the sense amplifier SA is a one-stage time delay in the best-pass operation mode.

In order to shorten the time delay, the signal may be rapidly raised to "H" level by a large driving force of a transistor (memory cell driving transistor) for driving the bit line $\overline{BL}$, and the bit line $\overline{BL}$ is rapidly pulled down to the "L" level so as to rapidly turn off the n-channel transistor N2.

Figure 5:
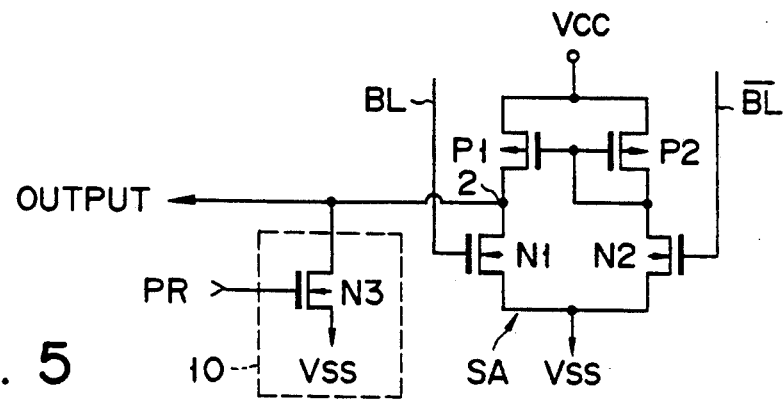
FIGS. 5 to 9 are circuit diagrams showing other embodiments according to the present invention

FIG. 5 shows a one-stage inverting sense amplifier as another embodiment of the present invention. Reference symbols BL and $\overline{BL}$ denote a pair of bit lines of each column of a memory cell array; and SA, a sense amplifier for sensing and amplifying a potential difference between the pair of bit lines (BL and $\overline{BL}$). Reference numeral 10 denotes an output potential setting circuit for precharging an output node 1 of the sense amplifier during a precharging period to a predetermined potential.

The sense amplifier SA is an n-channel input CMOS differential sense amplifier having a p-channel current mirror load. The sense amplifier SA is constituted by n-channel input transistors (N1 and N2), the gates of which are respectively connected to the bit lines (BL and $\overline{BL}$), and the sources of which are commonly connected to a ground potential $V_{SS}$, and p-channel load transistors (P1 and P2), the sources of which are commonly connected to a power supply potential $V_{CC}$, the gates of which are connected to each other, and the drains of which are respectively connected to the drains of the n-channel transistors (N1 and N2). The gate and drain of the p-channel transistor P2 are connected to each other, and an output is extracted from the drain (output node 1) of the n-channel transistor N1. A signal of "H" level is output when a potential of the bit line BL is lower than that of the bit line $\overline{BL}$, and a signal of "L" level is output when the potential of the bit lien $\overline{BL}$ is lower than that of the bit line BL.

The output potential setting circuit 10 is constituted by, e.g., an n-channel transistor N3 connected between the output node 1 of the sense amplifier SA and the $V_{SS}$ potential, and a precharge signal PR is applied to the gate of the n-channel transistor N3. With this arrangement, when the n-channel transistor N3 is turned on while the precharge signal PR is active ("H" level), and when the precharge signal PR is not active ("L" level), the n-channel transistor N3 is turned off.

Therefore, the output potential setting circuit 10 has a function to set the output potential of the sense amplifier SA in a data output state ("L" level here) corresponding to the worst-pass operation of the sense amplifier SA before the start of read access.

An operation mode as the best-pass operation of the sense amplifier SA is a case wherein the potential of the bit line BL becomes "L" level during the potential of the bit line $\overline{BL}$ is "H" level, and a signal of "H" level is output from the output node 1. In this operation mode, a one-stage time delay occurs. In contrast, the operation mode as the worst-pass operation of the sense amplifier SA is a case wherein the potential of the bit line $\overline{BL}$ becomes "L" level during the potential of the bit line BL is "H" level, and a signal of "L" level is output from the output node 1. Since the "L" level output is, however, predetermined by the function of the output potential setting circuit 10, no time delay occurs in this operation mode.

Figure 6:
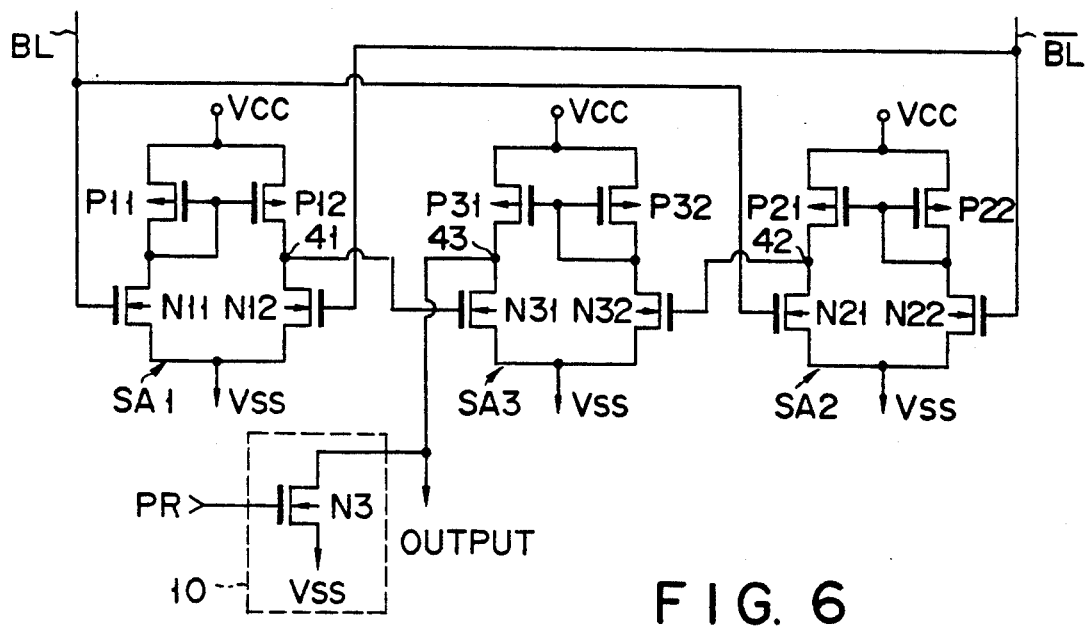

FIG. 6 shows a two-stage inverting sense amplifier as still another embodiment of the present invention. An output potential setting circuit 10 for precharging an output node 43 of the conventional two-stage inverting sense amplifier circuit described with reference to FIG. 1 to a predetermined potential during a precharging period is added. The same reference numerals as in FIG. 1 denote the same parts in FIG. 6, and a detailed description thereof will be omitted.

The output potential setting circuit 10 is, e.g., constituted by an n-channel transistor N3 connected between an output node 43 of a sense amplifier SA and a $V_{SS}$ potential. A precharge signal PR is applied to the gate of the n-channel transistor N3. With this arrangement, when the n-channel transistor N3 is turned on while the precharge signal PR is active ("H" level), and when the precharge signal PR is not active ("L" level), the n-channel transistor N3 is turned off.

The output potential setting circuit 10 therefore has a function to set the output potential from the sense amplifier SA in a data output state ("L" level here) corresponding to the worst-pass operation of the sense amplifier SA before the start of read access. When the operation of the sense amplifier SA shown in FIG. 6 is set in a worst-pass mode, as in the conventional sense amplifier circuit shown in FIG. 1, the first sense amplifier SA1 outputs a signal of "H" level, the second sense amplifier SA2 outputs a signal of "L" level, and a signal of "L" level is output from the output node 43 of the third sense amplifier SA3, because the potentials of the bit lines BL and $\overline{BL}$ respectively become "H" level and "L" level.

Note that the output potential setting circuit 10 may be another circuit which can be set in a data output state corresponding to a worst-pass operation of the sense amplifier SA before the start of read access, or another signal not limited by the precharge signal PR may be used. Alternatively, another arrangement different from the above-described arrangement may be used.

Figure 7:
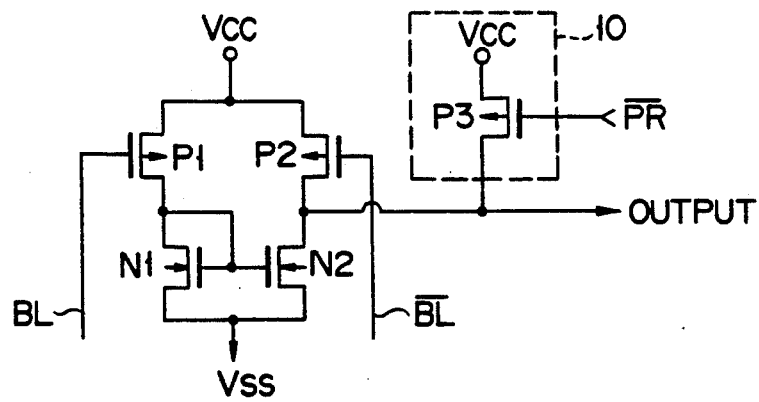
Figure 8:
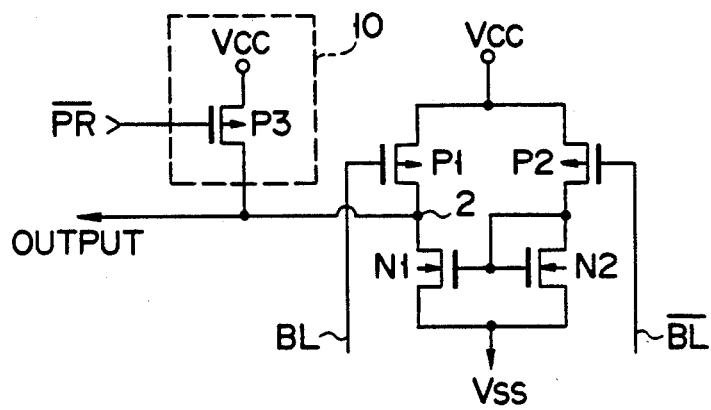
Figure 9:
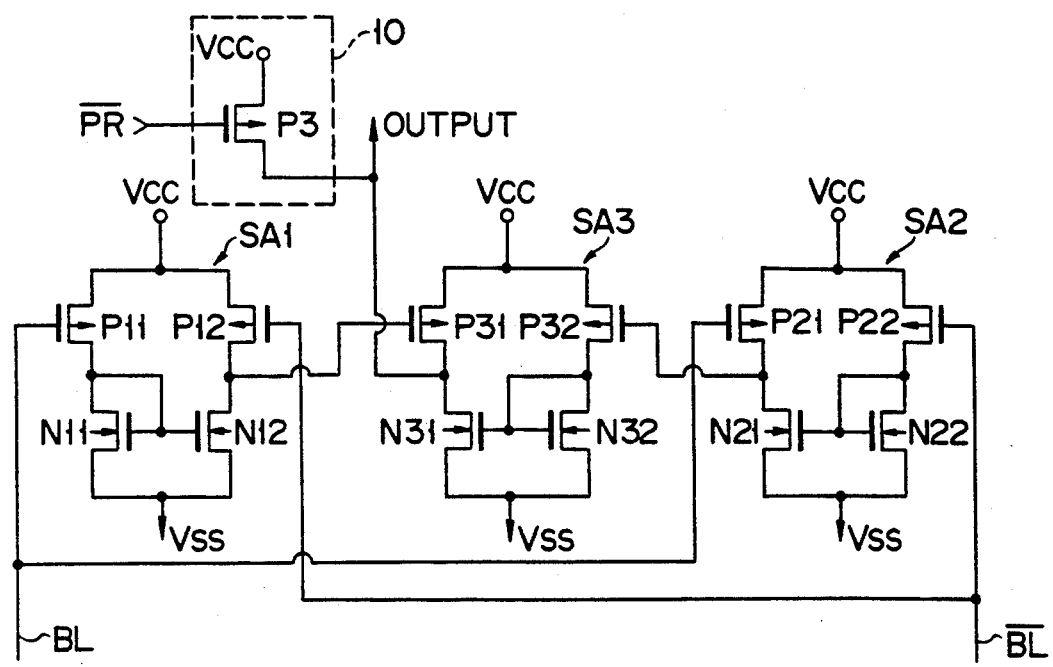

As shown in FIGS. 7 to 9, when the present invention is applied to a one-stage or two-stage, non-inverting or inverting p-channel input CMOS differential sense amplifier circuit having an n-channel current mirror load, an output node may be set at "H" level before the start of read access.

In addition, the present invention can be applied to a sense amplifier circuit ON/OFF-controlled by a sense enable control signal. Furthermore, the present invention can be applied to a sense amplifier circuit that a pair of complementary bit lines are precharged to ½ of a power supply potential $V_{CC}$ during a precharging period.

As described above, according to a sense amplifier circuit according to the present invention, since it is set in a data output state corresponding to a worst-pass operation of a sense amplifier circuit before the start of read access (e.g., after release of precharge), a high operation speed can be achieved, and a high read speed of an entire memory can be achieved.

Therefore, when it is difficult that a read speed satisfies technical specifications, the specifications can be easily satisfied by an application of the present invention, resulting in an increase in yield of semiconductor memories.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A sense amplifier circuit comprising:
   a first bit line supplied with a signal;
   a second bit line supplied with a signal complementary to said signal supplied to said first bit line;
   a circuit output terminal;
   a first transistor of a first conductivity type, having a gate and a current path, the gate being connected to said first bit line, and one terminal of the current path being connected to a first power source;
   a second transistor of said first conductivity type, having a gate and a current path, the gate being connected to said second bit line, and one terminal of the current path being connected to said first power source;
   a third transistor of a second conductivity type, having a gate and a current path, the gate and one terminal of the current path being connected to another terminal of said current path of said first transistor of the first conductivity type, and the other terminal of the current path being connected to a second power source;
   a fourth transistor of said second conductivity type, having a gate and a current path, one terminal of the current path being connected to another terminal of said current path of said second transistor of the first conductivity type and said circuit output terminal, the other terminal of the current path being connected to said second power source, and the gate being connected to the gate of said third transistor of the second conductivity type; and
   an output potential setting circuit for setting a potential on said circuit output terminal before data read access so that an output logic level of the circuit output terminal becomes a logic level appearing on the circuit output terminal when the sense amplifier circuit presents a worst-pass operation, the output potential setting circuit comprising a fifth transistor of said first conductivity type, having a gate and a current path, the current path being connected between said circuit output terminal and said first power source, and the gate being supplied with a precharge signal of said bit lines to render the fifth transistor conductive so that said circuit output terminal is set to a potential of said first power source before data read access.

2. A sense amplifier circuit comprising:
   first and second bit lines;
   first and second sense amplifiers for amplifying a voltage between said first and second bit lines;
   a circuit output terminal;
   a first transistor of a first conductivity type, having a gate and a current path, the gate being connected to an output terminal of said first sense amplifier, and one terminal of the current path being connected to a first power source;
   a second transistor of said first conductivity type, having a gate and a current path, the gate being connected to an output terminal of said second sense amplifier and one terminal of the current path being connected to said first power source;
   a third transistor of a second conductivity type, having a gate and one terminal of the current path being connected to another terminal of said current path of said first transistor of the first conductivity type, and the other terminal of the current path being connected to a second power source;

a fourth transistor of said second conductivity type, having a gate and a current path, one terminal of the current path being connected to another terminal of said current path of said second transistor of the first conductivity type and said circuit output terminal, the other terminal of the current path being connected to said second power source, and the gate being connected to the gate of said third transistor of the second conductivity type; and an output potential setting circuit for setting a potential on said circuit output terminal before data read access so that an output logical level of the circuit output terminal becomes a logic level appearing on the circuit output terminal when the sense amplifier circuit presents a worst-pass operation, the output potential setting circuit comprising a fifth transistor of said first conductivity type, having a gate and a current path, the current path being connected between said circuit output terminal and said first power source, and the gate being supplied with a precharge signal of said bit lines to render the fifth transistor conductive so that said circuit output terminal is set to a potential of said first power source before data read access.

3. A sense amplifier circuit according to claim 1 or 2, wherein said first, second and fifth transistors of the first conductivity type are N channel MOS transistors, and said output terminal is set to a low level after the bit lines are precharged.

4. A sense amplifier circuit according to claim 1 or 2, wherein said first, second and fifth transistors of the first conductivity type are P channel MOS transistors, and said output terminal is set to a high level after the bit lines are precharged.

* * * * *